United States Patent [19]

Turner et al.

[11] 4,052,598
[45] Oct. 4, 1977

[54] CONTROL SYSTEM WITH FAST RESPONSE

[75] Inventors: Raymond J. Turner, Fountain Valley; Andrew M. Kameya, Costa Mesa; Naif D. Salman, Orange, all of Calif.

[73] Assignee: Hycom Incorporated, Irvine, Calif.

[21] Appl. No.: 682,734

[22] Filed: May 3, 1976

[51] Int. Cl.$^2$ ............................................. G06F 15/46
[52] U.S. Cl. ................................... 364/113; 364/433; 364/601
[58] Field of Search ................ 235/183, 150.51, 150.1, 235/151, 151.1; 340/15.5 GC, 347 AD

[56] References Cited

U.S. PATENT DOCUMENTS

| | | | |
|---|---|---|---|
| 3,011,709 | 12/1961 | Jacoby | 235/151 |
| 3,466,596 | 9/1969 | Siems et al. | 340/15.5 GC |
| 3,614,633 | 10/1971 | Yalyshev et al. | 235/183 |
| 3,622,767 | 11/1971 | Koepcke | 235/151.1 |
| 3,919,685 | 11/1975 | Haill | 340/15.5 GC |
| 3,958,213 | 5/1976 | Scott et al. | 340/15.5 GC |
| 4,016,557 | 4/1977 | Zitelli et al. | 340/347 AD |

Primary Examiner—Felix D. Gruber
Attorney, Agent, or Firm—Gordon L. Peterson

[57] ABSTRACT

A control system comprising a gain control circuit for adjusting the gain of an input signal to provide a gain controlled signal and an integrator for integrating the gain controlled signal to provide an output signal. A first circuit responds to a particular condition for changing the gain of the gain control circuit and a second circuit responds to that same condition for changing the output signal independently of the gain control signal to bring about a more rapid change in the output signal than could be brought about solely by changing the gain controlled signal.

18 Claims, 2 Drawing Figures

CONTROL SYSTEM WITH FAST RESPONSE

BACKGROUND OF THE INVENTION

In many electrical control systems, there is an undesirable time lag between the instant at which a correction in the output signal is commanded and the instant at which the full correction of the output signal is realized. This occurs, for example, in a control system which includes a gain control circuit and an integrator. In this kind of control system, the gain control circuit receives an input signal and controls its gain to provide a gain controlled signal. The integrator integrates the gain controlled signal to provide an output signal. The output signal is monitored by a threshold detector which in turn controls the gain of the gain control circuit.

If the output signal is outside the limits established by the threshold detector, the threshold detector provides a signal to change the gain of the gain control circuit. Because the integrator performs delaying function, it will fully respond to the change in the gain control signal only after some period of time has elapsed. If the gain of the gain control circuit is changed while the integrator is responding, the loop will be unstable and oscillate. Accordingly, it is necessary to prevent further gain changes of the gain control circuit during this response time, and this significantly slows down the response time of the loop.

It can be seen that two separate problems exist with a control system of this type. First, the integrator inherently has an undesirably slow response. Secondly, during the integrator's relatively long response time, the control system is, in a sense, out of control because it is disabled from making additional gain changes. This problem exists not only with integrators, but with any circuit which has significant delay.

SUMMARY OF THE INVENTION

The present invention provides a control system with substantially faster response than has been obtainable previously. This is accomplished by making a correction in the output signal at the same time that the gain is corrected. With this arrangement, the output signal is immediately corrected to the appropriate value so that the output of the control system changes instantly with no time lag. In other words, the inherent delay of the integrator or other component is overcome. In addition, because the inherent delay is overcome, the control system does not need to be prevented from making immediate gain changes. Thus, the system is fully controlled at all times.

The correction made in the output signal preferably corresponds to the correction which would have been made in the output signal as a result of the gain change after the normal response time. However, the change in the output signal may correspond to only a part of such change. In either event, it is necessary that the gain change of the gain control circuit bring about a predictable change in the output signal so that the correction in the output signal can be calculated. Although the present invention is applicable to both analog and digital implementation, it is easier to implement in a digital system because the amount by which to change the output signal for a given gain change can be more accurately determined.

The present invention is applicable to a control system including a gain control circuit and an integrator; however, it is equally applicable to control systems which do not have one or both of these components. For example, the invention is applicable to a control system which includes first signal processing means for processing an input signal in accordance with a first program to provide a first signal, and second signal processing means for processing the first signal in accordance with a second program to provide an output signal which is related to the first signal and the second program. The first program should have at least one variable. For example, the first signal processing means may include a gain control circuit, in which event, the variable is gain and the program is multiplication of the input signal. Alternatively, the first signal processing means may be a circuit which adds a constant to the input signal, delays the input signal, or does a combination of these and/or other functions.

The second signal processing means can be any circuit or component that has some appreciable delay. For example, the second signal processing means may be, or include, an integrator, a differentiator, a multiplier, an adder, a divider, or a delay circuit, or any combination of these and/or other components. What constitutes the variable and the programs depend on the component or components that make up the signal processing means.

The first and second signal processing means receive correction signals in response to a particular conditions. For example, the particular condition may be a characteristic of the output signal, a characteristic of the input signal, or a condition which is external to the control circuit. Thus, the invention is not limited to feedback loops, but may also be used in a feed-forward system or in a system in which the monitored condition is external of the control system.

The specific manner in which the output signal is immediately corrected or changed will vary depending upon the particular component or components utilized for the second signal processing means. For example, if a component is employed which averages the value of the first signal with a particular value related to at least one previous value of the output signal, the correction can be immediately applied to the next calculation of the output signal by using it to calculate the particular value which is used in the averaging process.

The invention, together with further features and advantages thereof may best be understood by reference to the following description taken in connection with the accompanying illustrative drawing.

DESCRIPTION OF THE PREFERRED EMBODIMENT

Figure 1:
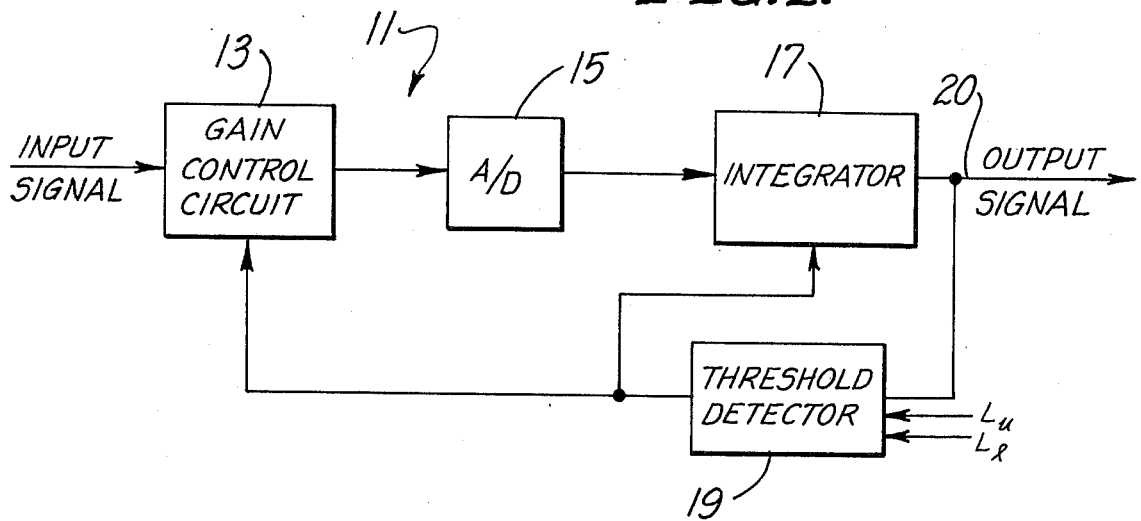
FIG. 1 is a block diagram of one form of control system constructed in accordance with the teachings of this invention.

FIG. 1 shows a control system 11 which generally includes first signal processing means in the form of a gain control circuit 13, an analog to digital converter 15, second signal processing means in the form of an integrator 17, and a threshold detector 19. The gain control circuit 13 receives an input signal and changes its power level to provide a gain controlled signal at its output. The gain of the gain control circuit 13 is adjustable in discrete steps, and a predetermined gain change results in a predictable change in the output of the integrator 17. The gain control circuit 13 may be either for analog or digital signals, and in the embodiment illustrated, the input signal has an analog format, and the gain control circuit is adapted for use with an analog input signal. Gain control circuits of this kind are known, and for this reason, the details of the gain control circuit 13 are not described in greater detail herein.

The gain controlled signal is fed to the analog to digital converter 15 which converts the gain controlled signal to a digital format in accordance with conventional practice. The gain controlled signal is then fed to the integrator 17 which performs an integrating function to provide an output signal on a conductor 20. If desired, other circuit components can be provided between the gain control circuit 13 and the integrator 17.

The output signal from the integrator 17 is monitored by the threshold detector 19. So long as the monitored characteristic of the output signal is within a predetermined range, the threshold detector 19 provides no correction signals to the gain control circuit 13 and to the integrator 17. However, if the characteristic of the output signal which is monitored by the threshold detector 19 falls outside of the predetermined range, the threshold detector simultaneously provides a correction signal to the gain control circuit 13 and to the integrator 17.

The gain control circuit 13 responds to the correction signal in a known manner to provide a predetermined amount of gain change. Similarly, the integrator 17 responds to the correction signal to provide a change in the output signal. The change provided by the integrator 17 to the output signal is preferably the same change which would have been brought about over a longer time period as a result of changing the gain of the gain control circuit 13. The change in the output signal in response to the correction signal is independent of the change in the gain controlled signal.

The threshold detector 19 can monitor various values or characteristics of the output signal such as voltage amplitude, power amplitude, current amplitude, frequency, phase, etc. The threshold detector 19 can be virtually any limit detector which compares the measured values of the output signal with reference values. The threshold detector 19 can have any desired number of thresholds and provide signals indicaing the measured value of the output signal in relation to these thresholds; however, in the embodiment illustrated, it is assumed that the threshold detector compares the measured value of a characteristic of the output signal with an upper limit reference value $L_u$ and a lower limit reference $L_l$. Thus, the correction signal provided by the threshold detector 19 to the gain control circuit 13 simply requires that the gain be either increased or decreased by a predetermined amount, such as a factor $n$. Similarly, the correction signal to the integrator 17 requires only that the output signal be increased or decreased by a predetermined amount, such as a factor $n$ or approximately said factor $n$. If the threshold detector 19 detects within a larger number of ranges, it would provide correction signals indicating various magnitudes of correction depending upon the values of the monitored characteristic of the output signal.

Figure 2:
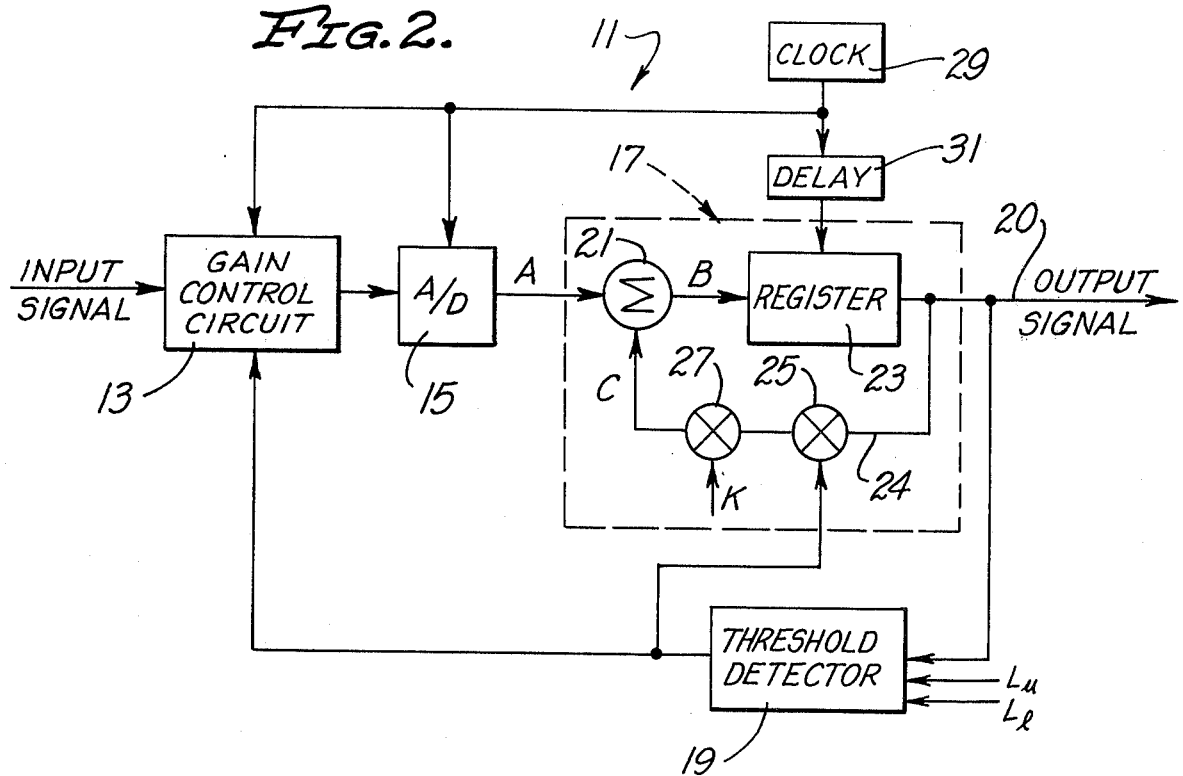
FIG. 2 is a more detailed diagram of the control system shown in FIG. 1.

FIG. 2 shows, by way of example, one way in which the output signal can be changed in response to the correction signal from the threshold detector 19. It should be understood, however, that the implementation shown in FIG. 2, and in particular the implementation of the integrator 17, is purely illustrative and that various other implementations may be employed within the scope of the present invention.

As shown in FIG. 2, the integrator 17 includes an adder 21, a register 23, and a loop 24 leading from the output of the register 23 back to the adder 21. The loop 24 includes multipliers 25 and 27. The gain control circuit 13, the analog to digital converter 15 and the register 23 are controlled by a clock 29 which provides a train of clock pulses. The gain of the gain control circuit 13 can be changed only with each clock pulse to the gain control circuit. The clock pulses to the register 23 are delayed slightly by a delay circuit 31. The length of this delay may be selected by those skilled in the art and may be, for example, one-half of the interval between adjacent clock pulses.

The adder 21 is coupled to receive the digital gain controlled signal A and a digital signal C, the value of which is related to the immediately preceding value of the output signal as described hereinbelow. With each clock pulse from the clock 29, the analog to digital converter 15 samples the analog gain controlled signal from the gain control circuit 13 to provide the signal A in digital format. In response thereto, the adder sums the signals A and C to provide a summed signal B to the register 23. The signal B is held in the register 23 until the clock pulse from the clock 29 is transmitted by the delay circuit 31 to the register, whereupon the signal B is provided on the conductor 20 as the output signal. The register 23 holds the output signal on the conductor 20 and in the loop 24 until the next clock pulse from the delay 31. Preferably, the analog to digital converter 15 and the register 23 are operated by the same clock pulse, although the clock pulse to the register 23 is delayed slightly, so that the output signal is provided before the next clock pulse causes the analog to digital converter to again sample its analog input.

The output signal also appears in the loop 24. Specifically, the output signal is multiplied in the multiplier 25 by the correction signal from the threshold detector 19. If the monitored characteristic of the output signal is within the upper limit $L_u$ and the lower limit $L_l$ of the threshold detector 19, the correction signal is one, in which event the multiplier 25 has no effect on the signal in the loop 24. However, if the output signal is above the upper limit $L_u$, the correction signal may be, for example, a number less than one such as 0.7. Conversely, if the output signal is below the lower limit $L_l$, the correction signal may represent a number greater than 1 such as 1.3.

The product obtained in the multiplier 25 is fed to the multiplier 27 where it is multiplied by a time constant K of the integrator 17. In the embodiment illustrated, the time constant K may be any number between zero and one. If $K=1$, the component 17 is a digital integrator; however, if $K<1$, the component 17 can be better characterized as a weighted time averager. The product of the multiplier 27 is the signal C. Thus, the signal C has a value which is related to the immediately preceding value of the output signal. In the embodiment illustrated, this relationship is $C=KnO$ where $K$ is the time constant of the integrator 17;

$n$ is the correction signal from the threshold detector 19; and, $O$ is the immediately preceding value of the output signal. Thus, the program for the component 17 includes the relationship $B=A+C$ or $b=A+KnO$ where the correction signal $n$ is a variable.

The response of the system 11 would be much slower if the multiplier 25 were not provided and if the threshold detector 19 did not provide a correction signal directly to the integrator 17. This can be illustrated by way of an example in which $K=0.5$, $A=1$, $C=1$, $B=2$, the value of the output signal is 2, $L_u=1$, and $n=0.5$ when the output signal is greater than 1. The threshold detector 19 monitors the output signal and determines that it exceeds $L_u=1$. Accordingly, the threshold detector 19 provides a correction signal to the gain control circuit indicating that the gain should be multiplied by 0.5. Upon the occurrence of the next clock pulse, the value of the signal A is immediately reduced to 0.5; however, the value of the signal C remains at 1 and so the summation of the signals A and C; i.e., the signal B equals 1.5, and this is still well above the upper limit of 1.

In a typical prior art system, no further correction in the gain control circuit 13 would be permitted until enough time had elapsed to permit the output signal to stabilize; i.e., to fully realize the change resulting from the initial gain change. This takes considerable time as shown in Table 1 below in which decimals are rounded off as shown and any number less than 0.002 is read as zero:

TABLE I

| Signal A | Signal C | Signal B |
|---|---|---|
| 1 | 1 | 2 |
| .5 | 1 | 1.5 |
| .5 | .75 | 1.25 |
| .5 | .625 | 1.125 |
| .5 | .563 | 1.063 |
| .5 | .532 | 1.032 |
| .5 | .515 | 1 |

By way of contrast, with the present invention, the correction signal of 0.5 is provided by the threshold detector 19 and is simultaneously transmitted before the next clock pulse to the gain control circuit 13 and to the multiplier 25. The output of the multiplier 25, which operates continuously, would then be equal to 2 times 0.5 or 1 and the output of the multiplier 27 would be equal to 1 times 0.5 or 0.5. The value of the signal A is cut in half because the gain of the gain control circuit 13 is cut in half and thus equals 0.5. The summation of the signals A and C then equals 1. It can be seen, therefore, that the correction is immediately obtained; i.e., the correction is obtained upon the next clock pulse. Because the response time is so rapid, there is no need to prevent immediate further changes in the correction signal should monitoring of the output signal prove that to be warranted. Rather, a new gain change can be provided on the next clock pulse to the gain control circuit.

Various other components may be provided, if desired, between the gain control circuit 13 and the integrator 17. If any of these additional components, like the integrator 17, provide significant delay, a correction signal can be provided to such delay component from the threshold detector 19. In other words, the correction signal from the threshold detector 19 can be used to immediately change the output of more than one component of the control system 11.

The specific manner in which the correction signal changes the output of the integrator 17 or other delay component will depend upon various factors such as the function performed by that component and the amount of correction desired. For example, if the integrator 17 were replaced with a squaring circuit and the gain of the gain control circuit 13 were doubled, then it would be necessary to increase the output signal from the squaring circuit by a factor of 4.

Although an exemplary embodiment of the invention has been shown and described, many changes, modifications and substitutions may be made by one having ordinary skill in the art without necessarily departing from the spirit and scope of this invention.

We claim:

1. A control system comprising:
   first signal processing means for processing an input signal in accordance with a first program to provide a first signal, said first program having at least one variable;
   second signal processing means for processing the first signal in accordance with a second program to provide an output signal which is related to the first signal and the second program whereby a change in said variable of said first signal will provide a predictable change in the output signal;
   means responsive to a particular condition for changing said variable of said first program;
   means responsive to said particular condition for changing the output signal in a way to bring about at least a portion of said predictable change in the output signal more rapidly than could be brought about solely by said first signal; and
   said means for changing said variable including threshold detector means responsive to a predetermined characteristic of the output signal being outside of a particular range of values for providing a correction signal to the first signal processing means and means responsive to the correction signal for changing said variable of said first program.

2. A control system comprising:
   first signal processing means for processing an input signal in accordance with a first program provide a first signal, said first program having at least one variable;
   second signal processing means for processing the first signal in accordance with a second program to provide an output signal which is related to the first signal and the second program whereby a change in said variable of said first signal will provide a predictable change in the output signal;
   means responsive to a particular condition for changing said variable of said first program;
   means responsive to said particular condition for changing the output signal in a way to bring about at least a portion of said predictable change in the output signal more rapidly than could be brought about solely by said first signal; and
   said means for changing the output signal including threshold detector means responsive to a predetermined characteristic of the output signal being outside of a particular range of values for providing a correction signal to the second signal processing means and means responsive to the correction signal for bringing about at least a portion of said predictable change in the output signal.

3. A control system as defined in claim 2 wherein said first signal processing means includes a gain control means for adjusting the gain of the input signal to provide said first signal and said variable is the gain of the gain control means.

4. A control system as defined in claim 2 wherein the input signal has an analog format and said control system includes an analog to digital converter between the first signal processing means and the second signal processing means for converting the first signal from an analog format to a digital format.

5. A control system as defined in claim 2 wherein said particular condition is a condition of the output signal and said means for changing said variable and said means for changing the output signal are responsive to said condition of the output signal.

6. A control system comprising:
first signal processing means for processing an input signal in accordance with a first program to provide a first signal, said first program having at least one variable;
second signal processing means for processing the first signal in accordance with a second program to provide an output signal which is related to the first signal and the second program whereby a change in said variable of said first signal will provide a predictable change in the output signal;
means responsive to a particular condition for changing said variable of said first program;
means responsive to said particular condition for changing the output signal in a way to bring about at least a portion of said predictable change in the output signal more rapidly than could be brought about solely by said first signal; and
said second signal processing means including means for adding the value of the first signal with a value related to at least one preceding value of the the output signal, said means for changing the output signal being responsive to said particular condition for changing said second mentioned value to thereby change the output signal.

7. A control system as defined in claim 6 wherein the means for changing the varible is responsive to the particular condition for changing the variable by a factor $n$ and said means for changing the output signal changes said second mentioned value by approximately said factor $n$.

8. A control system comprising:
first signal processing means for processing an input signal in accordance with a first program to provide a first signal, said first program having at least one variable;
second signal processing means for processing the first signal in accordance with a second program to provide an output signal which is related to the first signal and the second program whereby a change in said varible of said first signal will provide a predictable change in the output signal, said second program having at least one variable;
means responsive to the output signal for changing said variable of said first program; and
means responsive to the output signal for changing the variable of the second program to change the output signal in a way to bring about at least a portion of said predictable change in the output signal more rapidly than could be brought about solely by changing the variable of the first program.

9. A control system comprising:
gain control means for adjusting the gain of an input signal to provide a gain controlled signal, said gain control means having an adjustable gain;
second signal processing means for processing the gain controlled signal in accordance with a program to provide an output signal which is related to the gain controlled signal and the program whereby a change in the gain of the gain control means will provide a predictable change in the output signal;
means responsive to the output signal for providing a first feedback signal to the gain control means;
said gain control means including means responsive to the first feedback signal for changing the gain of the gain control means;
means responsive to the output signal for providing a second feedback signal to the second signal processing means; and
said second signal processing means includes means responsive to said second feedback signal to bring about at least a portion of said predictable change in the output signal more rapidly than could be brought about solely by changing the gain of the gain control means.

10. A control system as defined in claim 9 wherein said second signal processing means includes means for adding the valve of the gain controlled signal to a value related to at least one preceding value of the output signal, and said means responsive to said second feedback signal changes said second-mentioned value the thereby change the output signal.

11. A control system as defined in claim 10 wherein said second-mentioned value is related to $KnO$ where $K$ is a constant having a value between zero and one, $n$ is the second feedback signal, and $O$ is said preceding value of the output signal.

12. A method of rapidly chaging an output signal in an automatic control system comprising:
processing an input signal in accordance with a first program to provide a first signal with said program having at least one variable;
processing the first signal in accordance with a second program having at least one variable to provide an output signal which is related to the first signal and the second program whereby a change in the variable of said first signal will provide a predictable change in the output signal;
changing said variable of said first program in response to the output signal; and
changing the variable of the second program in response to the output signal in a way to bring about at least a portion of said predictable change in the output signal more rapidly than could be brought about solely by changing said variable of the first program.

13. A method as defined in claim 12 wherein said steps of changing are carried out substantially simultaneously.

14. A method as defined in claim 12 wherein said first mentioned step of processing includes controlling the gain of the input signal with a gain control circuit and said variable of the first program is gain.

15. A method as defined in claim 12 wherein the second mentioned step of processing includes adding the value of the first signal with a value related to at least one preceding value of the output signal, said second mentioned step of changing includes changing said second mentioned value to thereby change the output signal, said second mentioned value including said variable of the second program.

16. A method as defined in claim 15 wherein said first mentioned step of changing includes changing the variable of the first program by a factor $n$ and said second mentioned step of changing includes changing said variable of the second program by approximately said factor $n$.

17. A method as defined in claim 15 wherein the preceding output signal is the immediately preceding output signal.

18. A method as defined in claim 12 wherein the input signal has an analog format and the method includes converting the first signal from an analog format to a digital format with an analog to digital converter.

* * * * *